(12) United States Patent
Lin

(10) Patent No.: US 6,667,644 B2
(45) Date of Patent: Dec. 23, 2003

(54) DEVICE FOR CONTROLLING CLOCK SIGNAL PHASE TO REDUCE CLOCK SKEW

(75) Inventor: Reginald Lin, Taipei (TW)

(73) Assignee: Via Technologies, Inc., Taipei (TW)

( * ) Notice: Subject to any disclaimer, the term of this patent is extended or adjusted under 35 U.S.C. 154(b) by 2 days.

(21) Appl. No.: 10/058,392

(22) Filed: Jan. 28, 2002

(65) Prior Publication Data

US 2003/0098732 A1 May 29, 2003

(30) Foreign Application Priority Data

Nov. 23, 2001 (TW) ...................................... 90129015 A

(51) Int. Cl.[7] ................................................. H03L 7/00
(52) U.S. Cl. ....................... 327/163; 327/231; 327/297; 375/371
(58) Field of Search ................................ 327/165, 166, 327/299, 291, 295, 297, 162, 163, 231–237; 365/233, 233.5; 375/371, 362

(56) References Cited

U.S. PATENT DOCUMENTS 4,761,567 A * 8/1988 Walters et al. ............... 327/295
5,663,687 A * 9/1997 Kozu .......................... 331/14
5,859,550 A * 1/1999 Brandt ....................... 327/156
6,281,733 B1 * 8/2001 Miura et al. ................. 327/299

* cited by examiner

Primary Examiner—Minh Nguyen
(74) Attorney, Agent, or Firm—Volpe and Koenig, P.C.

(57) ABSTRACT

A device for controlling a clock signal phase to reduce the clock skew includes a clock signal generator, a pad circuit and a phase adjustment device. The clock signal generator is disposed in a chip for generating the clock signal. The pad circuit is disposed in the chip, and electrically connected between the clock signal generator and an external circuit, and includes an output buffer and an input buffer, wherein the output buffer transmits the clock signal to both the external circuit and the input buffer, and the input buffer further transmits the clock signal to a logic circuit module of the chip. The phase adjustment device is disposed in the chip and electrically connected between an output end of the input buffer and the logic circuit module of the chip for adjusting the clock signal required for the operation of the logic circuit module.

5 Claims, 3 Drawing Sheets

US 6,667,644 B2

DEVICE FOR CONTROLLING CLOCK SIGNAL PHASE TO REDUCE CLOCK SKEW

FIELD OF THE INVENTION

The present invention relates to a device for controlling a clock signal phase, and more particularly to a device for controlling a clock signal phase difference between two chips to reduce clock skew.

BACKGROUND OF THE INVENTION

While an integrated circuit chip is operating, it is desirable to synchronize the operation clock signals for circuits inside and outside the chip in order to avoid confusion of control signals and thus invalidation of the chip. However, there are many factors that may result in a clock skew problem. For example, a pad circuit which functions as an input/output buffer in a chip, the parasitic capacitance of an external circuit responsive to the clock signal, and the unpredicted operational temperature may be factors resulting in clock delay. Unfortunately, these factors cannot keep under control by the chip designer. Thus, it becomes an important issue for the chip designer to compensate the clock delay effect in order to avoid clock skew.

FIG. 1 is a functional block diagram schematically showing a conventional device for controlling a clock signal phase difference between an internal and an external circuits of a chip. As shown in FIG. 1, a typical chip includes a phase-locked loop (PLL) clock signal generator 10, a pad circuit 12 and a clock tree 13. A clock signal generated by the PLL clock signal generator 10 is transmitted out to another chip 19 via the pad circuit 12. The clock tree 13 is used to synchronize the clock signals received by different elements in the same chip. For controlling a clock signal phase difference between an output end 121 of the pad circuit 12 and an output end 131 of the clock tree 13, a data precision adjustment (DPA) device 11 is disposed between the PLL clock signal generator 10 and the pad circuit 12. The data precision adjustment device 11 is used for adjusting a clock signal phase of the output end 121 of the pad circuit 12. Ideally, the phase difference between the clock signal outputted from the output end 121 of the pad circuit 12 into the chip 19 and the clock signal outputted from the output end 131 of the clock tree 13 is zero. Unfortunately, the clock signal transmitted out from the pad circuit 12 is inherently delayed to an extent, and the loading of the trace on the circuit board between the output end 121 of the pad circuit 12 and the chip 19 is hard to be controlled. Hence, when the trace on the circuit board is changed, it is necessary for the data precision adjustment device 11 to perform another adjusting operation due to the altered loading. It is troublesome for the designer and the producer.

Please refer to FIG. 2 which is a functional block diagram illustrating another conventional clock-signal-phase control device. A clock signal generated from a phase-locked loop (PLL) clock signal generator 20 is processed by a clock tree 21 and a first data precision adjustment (DPA) device 22, and transmitted to a deskew PLL clock signal generator 23 as a reference signal. Then, the clock signal outputted from the deskew PLL clock signal generator 23 is transmitted to another chip 29 via a first pad circuit 24 and a circuit board trace 25. For precisely realizing a phase shift situation of the clock signal received by an input end 291 of the chip 29, a feedback signal is picked from a point M which is a half of the length 2L of the circuit board trace 25 distant from said input end 291, and transmitted back to an input end 261 of a second pad circuit 26 in the original chip via a feedback trace whose length is L. Under this circumstance, the connecting trace length from the first pad circuit 24 to the input end 291 of the chip 29 is equal to the feedback trace length from the first pad circuit 24 to the input end 261 of the second pad circuit 26, both being 2L. Hence, the phase shift of the input end 291 of the external chip 29 is expected to be the same as that of the input end 261 of a second pad circuit 26. The feedback signal is then processed by the second pad circuit 26 and a second data precision adjustment device 27, and transmitted to the deskew PLL clock signal generator 23 to be phase-locked, thereby eliminating the phase difference between the reference signal and the feedback signal. The clock skew problem can thus be efficiently solved. In this conventional control device, however, additional devices such as the deskew PLL clock signal generator 23 and the second pad circuit 26 are required to perform a feedback operation. As known, these additional devices will occupy some area of the chip and increase the production cost. Furthermore, with the increasingly rising of the working clock frequency, the design of the deskew PLL clock signal generator becomes more and more complicated and difficult.

Therefore, the purpose of the present invention is to develop a device for controlling a clock signal phase to deal with the above situations encountered in the prior art.

SUMMARY OF THE INVENTION

An object of the present invention is to provide a device for controlling a clock signal phase for use in a structure that a first chip outputs a clock signal to a second chip via an external circuit for reducing the clock skew.

Another object of the present invention is to provide a device for controlling a clock signal phase for use in a structure that a first chip outputs a clock signal to a second chip via an external circuit for improving the stability of the clock signal phase difference.

A further object of the present invention is to provide a device for controlling a clock signal phase for use in a structure that a first chip outputs a clock signal to a second chip via an external circuit for reducing the cost and the occupied area of the chip.

According to an aspect of the present invention, there is provided a device for controlling a clock signal phase for use in a structure that a first chip outputs a clock signal to a second chip via an external circuit. The device includes a clock signal generator disposed in the first chip for generating the clock signal, a pad circuit disposed in the first chip, electrically connected between the clock signal generator and the external circuit, and including an output buffer and an input buffer, wherein the output buffer transmits the clock signal to both of the external circuit and the input buffer, and the input buffer further transmits the clock signal to a logic circuit module of the first chip, and a phase adjustment device disposed in the first chip and electrically connected between an output end of the input buffer and the logic circuit module of the first chip for adjusting the clock signal required for the operation of the logic circuit module. For example, the external circuit can be a connecting trace, and the clock signal generator can be of a phase-locked loop (PLL) type.

Preferably, the phase adjustment device includes a clock tree electrically connected to the logic circuit module for delaying the clock signal received thereby by a preset time, and a data precision adjustment device electrically connected between the output end of the input buffer and an input end of the clock tree for compensating the clock signal received thereby to eliminate a clock signal phase difference between the logic circuit module and the output end of the input buffer.

According to another aspect of the present invention, the control device includes a clock signal generator disposed in the first chip for generating the clock signal, and a pad circuit electrically connected between the clock signal generator and the external circuit and including an output buffer and an input buffer. The output buffer transmits the clock signal to both of the external circuit and the input buffer, and the input buffer further transmits the clock signal to a logic circuit module of the first chip for the operation of the logic circuit module.

BRIEF DESCRIPTION OF THE DRAWINGS

The present invention may best be understood through the following description with reference to the accompanying drawings, in which.

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only; it is not intended to be exhaustive or to be limited to the precise form disclosed.

Figure 3:
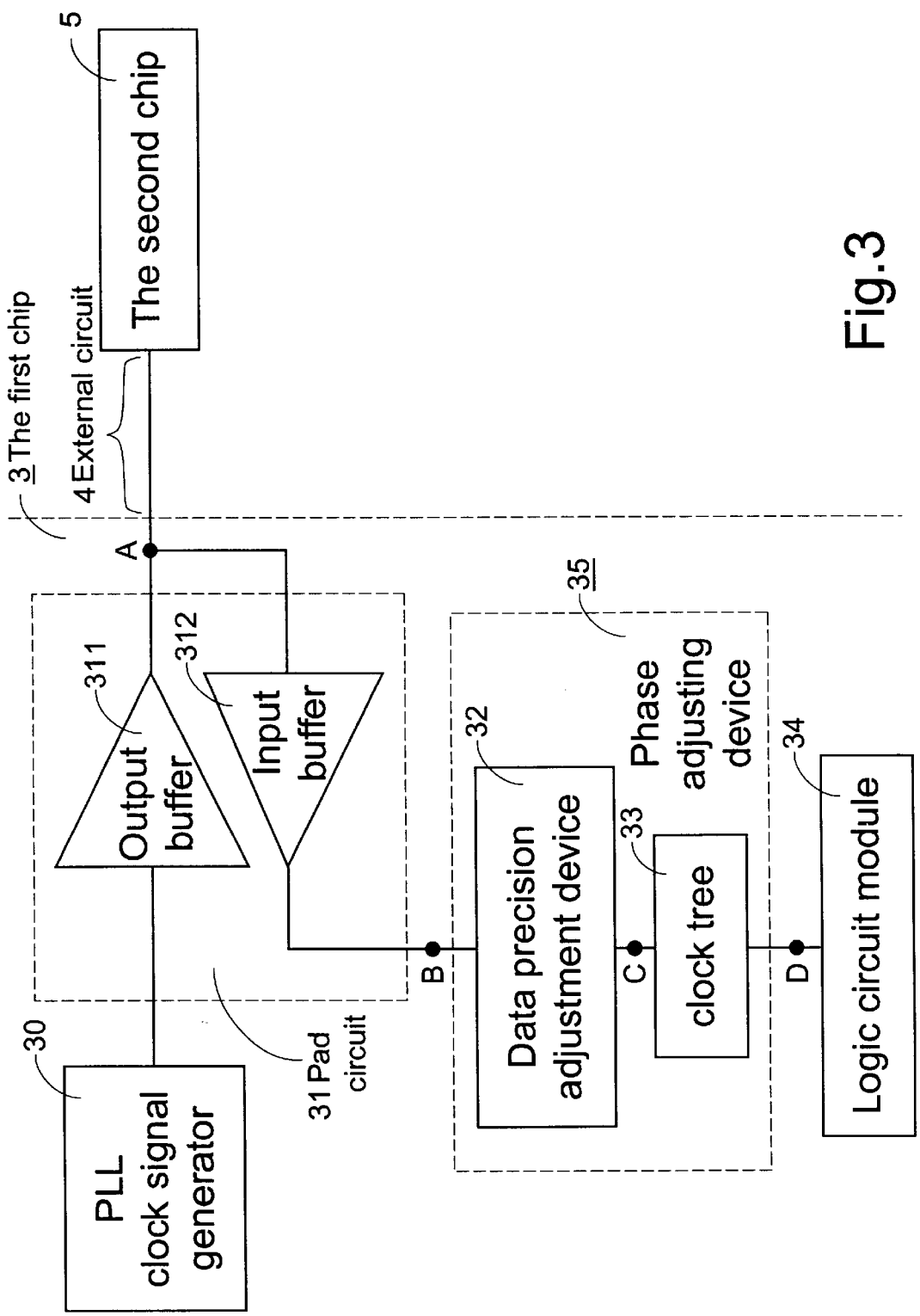
FIG. 3 is a functional block diagram illustrating a preferred embodiment of a device for controlling a clock signal phase to reduce the clock skew according to the present invention.

Please refer to FIG. 3, which is a functional block diagram illustrating a preferred embodiment of a device for controlling a clock signal phase to reduce the clock skew according to the present invention. As shown in FIG. 3, the device includes a phase-locked loop (PLL) clock generator 30, a pad circuit 31, a phase adjustment device 35 including a data precision adjustment (DPA) device 32 and a clock tree 33, and a logic circuit module 34. The pad circuit 31 is disposed in a first chip 3, and includes an output buffer 311 and an input buffer 312. The output buffer 311 is used for transmitting a clock signal generated from the PLL clock generator 30 to a second chip 5 via an external circuit 4 such as a connecting trace. At the tame time, the clock signal is also transmitted to the input buffer 312.

In the pad circuit 31, the output buffer 311 generally results in a clock skew more significant than the input buffer 312 does. For example, while the delay time range of the output buffer 311 is 1.5~2.9 ns, that of the input buffer 312 is only 0.1~0.3 ns. Hence, according to the present invention, the PLL clock signal generator 30 is not used as a direct source of the clock signal in the first chip 3. On the other hand, the direct source of the clock signal for the interior circuit of the first chip 3 is the input buffer 312. That is, after the clock signal transmitted through the output buffer 311 is received by the input buffer 312, the clock signal is further transmitted to the data precision adjustment (DPA) device 32 and the clock tree 33 to be deskewed, which will be described later, and then provided for the operation of the logic circuit module 34. Under this design, no matter how the external environment changes, e.g. how the loading feature of the connecting trace 4 changes, the delay time of clock signal phase between the points "A" and "B" located on opposite sides of the input buffer 312 as shown in FIG. 3 is 0.1~0.3 ns. Therefore, the clock signal phase difference between the points "A" and "B" is very stable and the error of the clock signal phase difference conforms to the requirement on the design standard of chip.

For synchronizing the clock signal phases of various circuits in the first chip, the clock tree 33 is used to adjust respective delay time for those circuits. The delay time are generally dependent on the size of the first chip and the travel distances of the clock signal to those circuits. In addition, for conforming the clock signal phase at point "D" to that at point "B", the data precision adjustment device 32 is used for phase adjustment. For example, when the clock tree 33 has a predetermined delay time t suitable for the clock signal of the logic circuit module 34 to be synchronized with that of the others, and the clock signal has a period T, the data precision adjustment device 32 adds a further delay time of the clock tree by T-t. This makes the phase difference between the clock signal received by the logic circuit module 34 at the point D and the clock signal outputted from the input buffer at the point B is substantially zero.

Figure 1:
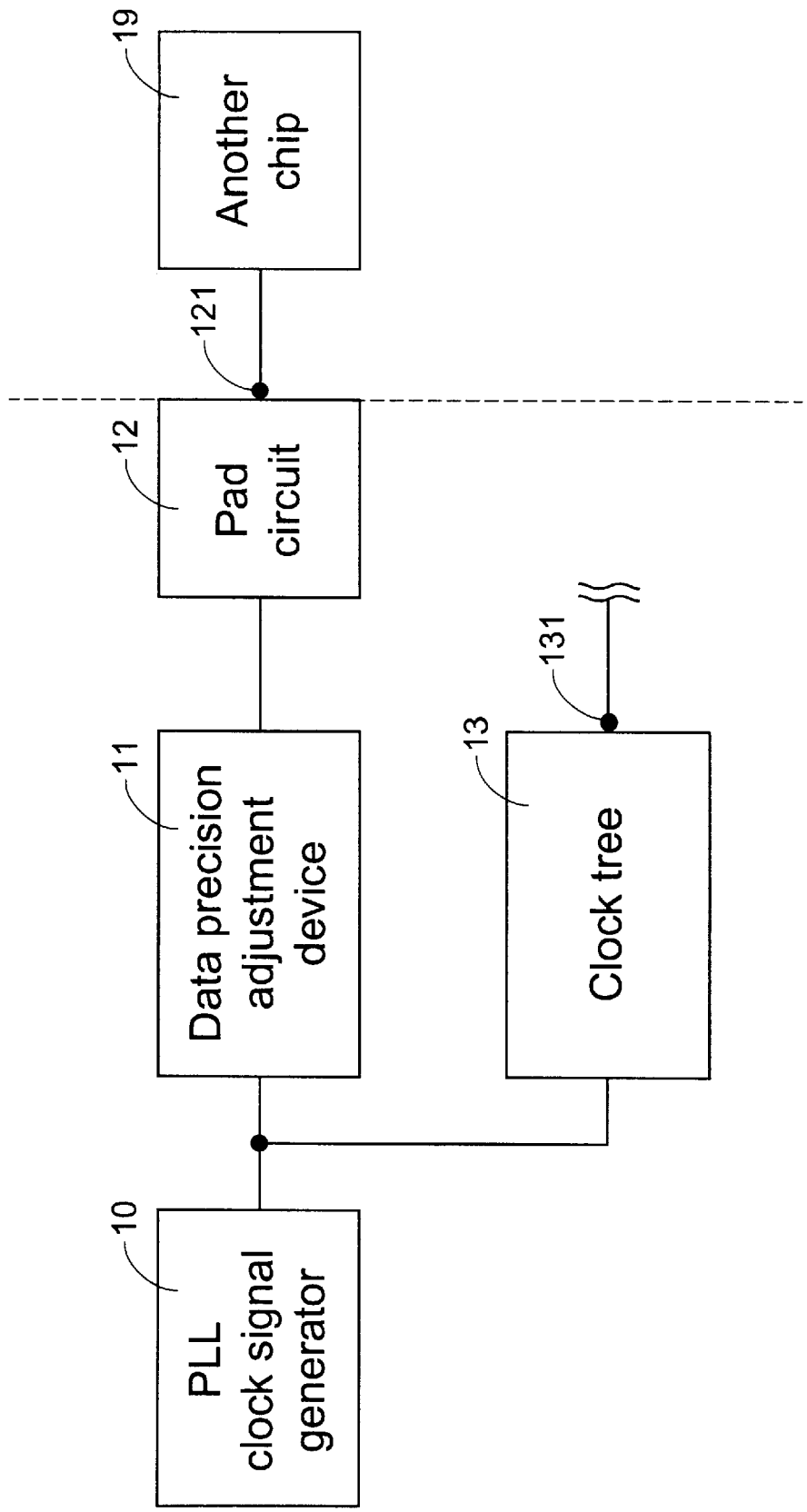
FIG. 1 is a functional block diagram schematically showing a conventional device for controlling a clock signal phase difference between an internal and an external circuits of a chip.
Figure 2:
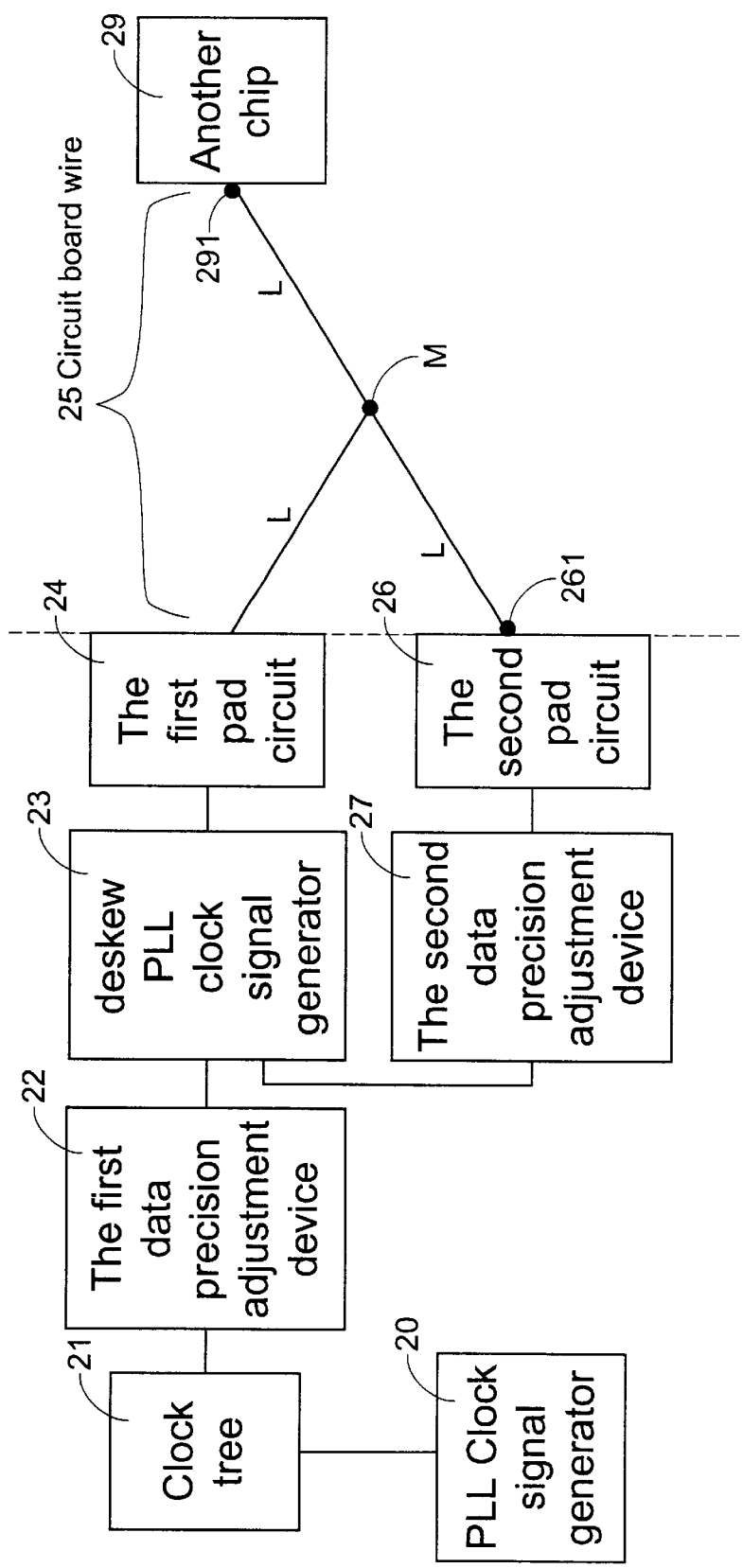
FIG. 2 is a functional block diagram illustrating another conventional clock-signal-phase control device.

To sum up, compared to the device shown in FIG. 1, the device according to the present invention has better stability in the phase difference of the clock signal between the output point to another chip and the output point to an inner logic circuit module. Furthermore, after circuit layout is completed, the delay time value of the data precision adjustment device 32 can be determined by post simulation. Moreover, the present device has a significantly simplified, cost-efficient and compact structure but acceptable clock deskew effect compared to the device shown in FIG. 2.

While the invention has been described in terms of what are presently considered to be the most practical and preferred embodiments, it is to be understood that the invention need not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A device or controlling a clock signal phase transmitted from a first chip to a second chip via an external circuit, said device comprising:

a clock signal generator disposed in said first chip for generating a clock signal;

a pad circuit disposed in said first chip, electrically connected between said clock signal generator and said external circuit, and including an output buffer and an input buffer, wherein said output buffer transmits said clock signal to both of said external circuit and said input buffer, and said input buffer further transmits said clock signal to a logic circuit module of said first chip;

a clock tree electrically connected to said logic circuit module for delaying said clock signal received thereby by a preset time; and a data precision adjustment device electrically connected between an output end of said input buffer and an input end of said clock tree for compensating said clock signal received thereby to eliminate a clock signal phase difference between said logic circuit module and said output end of said input buffer.

2. The device for controlling a clock signal phase according to claim 1 wherein said external circuit is a connecting trace which connects said second chip to said first chip on a circuit board.

3. The device for controlling a clock signal phase according to claim 1 wherein said clock signal generator is a phase-locked loop (PLL) clock signal generator.

4. The device for controlling a clock signal phase according to claim 1 wherein said output buffer results in a clock skew more significant than said input buffer does.

5. A device for controlling a clock signal phase transmitted from a first chip to a second chip via a connecting trace which connects said second chip to said first chip on a circuit board, said device comprising:

a clock signal generator disposed in said first chip for generating a clock signal;

a pad circuit disposed in said first chip, electrically connected between said clock signal generator and an external circuit, and including an output buffer and an input buffer, wherein said output buffer transmits said clock signal to both of said external circuit and said input buffer, and said input buffer further transmits said clock signal to a logic circuit module of said first chip;

a clock tree electrically connected to said logic circuit module for delaying said clock signal received thereby by a preset time; and a data precision adjustment device electrically connected between an output end of said input buffer and an input end of said clock tree for compensating said clock signal received thereby to eliminate a clock signal phase difference between said logic circuit module and said output end of said input buffer.

* * * * *